(12) United States Patent
Jiang et al.

(10) Patent No.: US 8,797,047 B2
(45) Date of Patent: Aug. 5, 2014

(54) METHOD AND DEVICE FOR CHECKING A SENSOR SIGNAL

(75) Inventors: Zheng-Yu Jiang, Regensburg (DE); Matthias Kretschmann, Regensburg (DE); Herbert Preis, Bach a.d. Donau (DE); Christoph Resch, München (DE)

(73) Assignee: Continental Automotive GmbH, Hannover (DE)

(*) Notice: Subject to any disclaimer, the term of this patent is extended or adjusted under 35 U.S.C. 154(b) by 1099 days.

(21) Appl. No.: 12/445,089

(22) PCT Filed: Sep. 14, 2007

(86) PCT No.: PCT/EP2007/059710
§ 371 (c)(1),
(2), (4) Date: Nov. 11, 2009

(87) PCT Pub. No.: WO2008/043639
PCT Pub. Date: Apr. 17, 2008

(65) Prior Publication Data
US 2010/0060296 A1 Mar. 11, 2010

(30) Foreign Application Priority Data
Oct. 13, 2006 (DE) .......................... 10 2006 048 604

(51) Int. Cl.
*G01R 29/26* (2006.01)

(52) U.S. Cl.
USPC ...... 324/614; 324/613; 324/76.29; 324/76.11

(58) Field of Classification Search
CPC .. G01R 29/26; G01R 23/163; G01R 31/3163; H04B 17/0062; H04L 12/2697
USPC ............ 324/613, 614; 702/193, 195; 714/817
See application file for complete search history.

(56) References Cited

U.S. PATENT DOCUMENTS

| | | | | |
|---|---|---|---|---|
| 4,977,376 A | * | 12/1990 | Schiek et al. | 324/613 |
| 5,434,509 A | * | 7/1995 | Blades | 324/536 |
| 5,568,559 A | * | 10/1996 | Makino | 381/98 |
| 5,729,145 A | * | 3/1998 | Blades | 324/536 |
| 5,949,257 A | | 9/1999 | Ishikawa | 327/72 |
| 6,298,709 B1 | * | 10/2001 | Artzner et al. | 73/1.38 |
| 6,363,344 B1 | * | 3/2002 | Higuchi | 704/226 |
| 7,133,715 B1 | * | 11/2006 | Smits et al. | 600/544 |
| 7,222,056 B2 | | 5/2007 | Wiechers | 702/190 |
| 7,626,639 B2 | * | 12/2009 | Yamauchi | 348/607 |

(Continued)

FOREIGN PATENT DOCUMENTS

| | | | | |
|---|---|---|---|---|
| DE | 19744273 A1 | 4/1998 | | G01D 1/18 |
| DE | 10239610 B3 | 6/2004 | | G01D 3/08 |

(Continued)

OTHER PUBLICATIONS

International PCT Search Report, PCT/EP2007/059710, 5 pages, Mailed Jan. 24, 2008.

(Continued)

*Primary Examiner* — Richard Isla Rodas
(74) *Attorney, Agent, or Firm* — King & Spalding L.L.P.

(57) ABSTRACT

Depending on a sensor signal, a noise signal which suppresses a useful signal spectrum of the sensor signal is determined by filtering using a filter. A noise variable, which is a measure of a noise of the sensor signal, is determined depending on the noise signal. An error of the sensor signal is identified depending on the noise variable determined.

19 Claims, 3 Drawing Sheets

(56) References Cited

U.S. PATENT DOCUMENTS

| | | | |
|---|---|---|---|
| 2001/0015197 A1 | 8/2001 | Elliott et al. | 123/406.16 |
| 2005/0091966 A1 | 5/2005 | Hashimoto | 60/277 |
| 2005/0107982 A1* | 5/2005 | Sun et al. | 702/179 |
| 2005/0182581 A1* | 8/2005 | Hashemian | 702/105 |
| 2006/0042960 A1* | 3/2006 | Tice | 205/775 |
| 2006/0142975 A1 | 6/2006 | Wiechers | 702/189 |
| 2006/0155511 A1 | 7/2006 | Steinmueller et al. | 702/176 |
| 2012/0249158 A1* | 10/2012 | Schmelzeisen-Redeker et al. | 324/537 |

FOREIGN PATENT DOCUMENTS

| | | | | |
|---|---|---|---|---|
| DE | 10259719 A1 | 7/2004 | | G01D 3/032 |
| DE | 10340793 A1 | 4/2005 | | G01D 1/00 |
| DE | 102004027800 A1 | 1/2006 | | G01L 1/00 |
| DE | 102005005152 A1 | 8/2006 | | G01D 3/032 |

OTHER PUBLICATIONS

German Office Action, German application No. 10 2006 048 604.8-52, 4 pages, May 15, 2007.

European Office Action, European application No. 07 820 216.5-2216, 3 pages, Sep. 1, 2009.

Rogers, S.; Proceedings of the 2003 American Control Conference: Sensor Noise Fault Detection; Denver, Colorado, vol. 6, pp. 4267-4268, Jun. 4, 2003.

\* cited by examiner

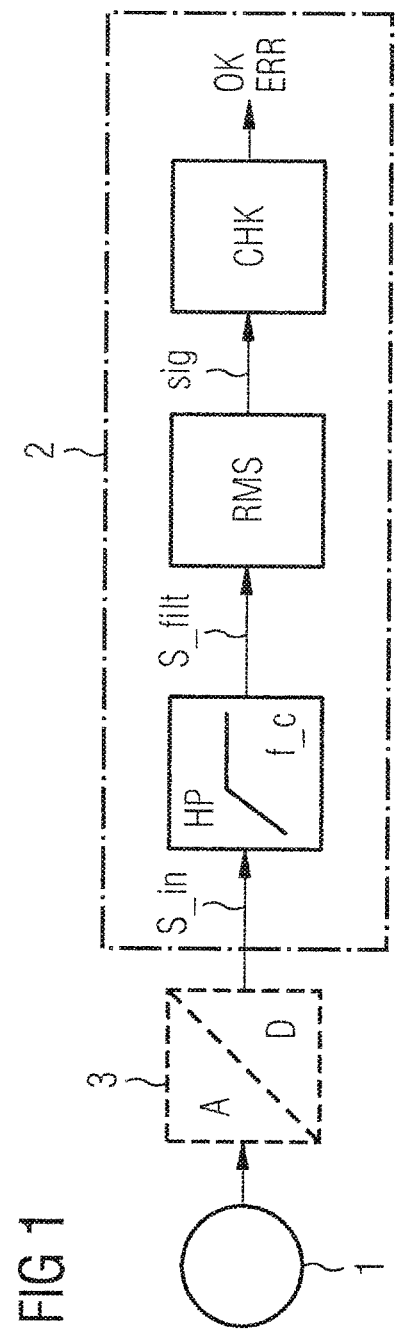

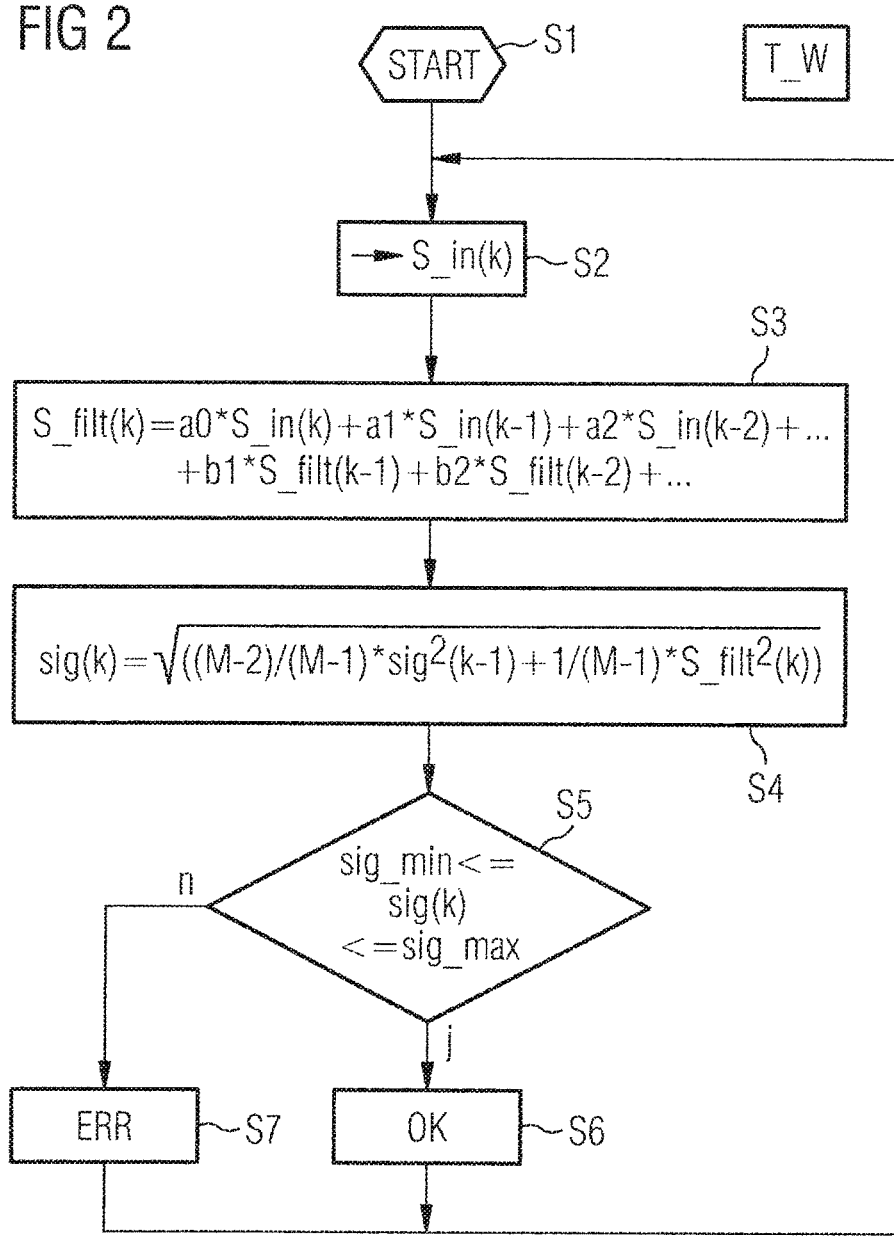

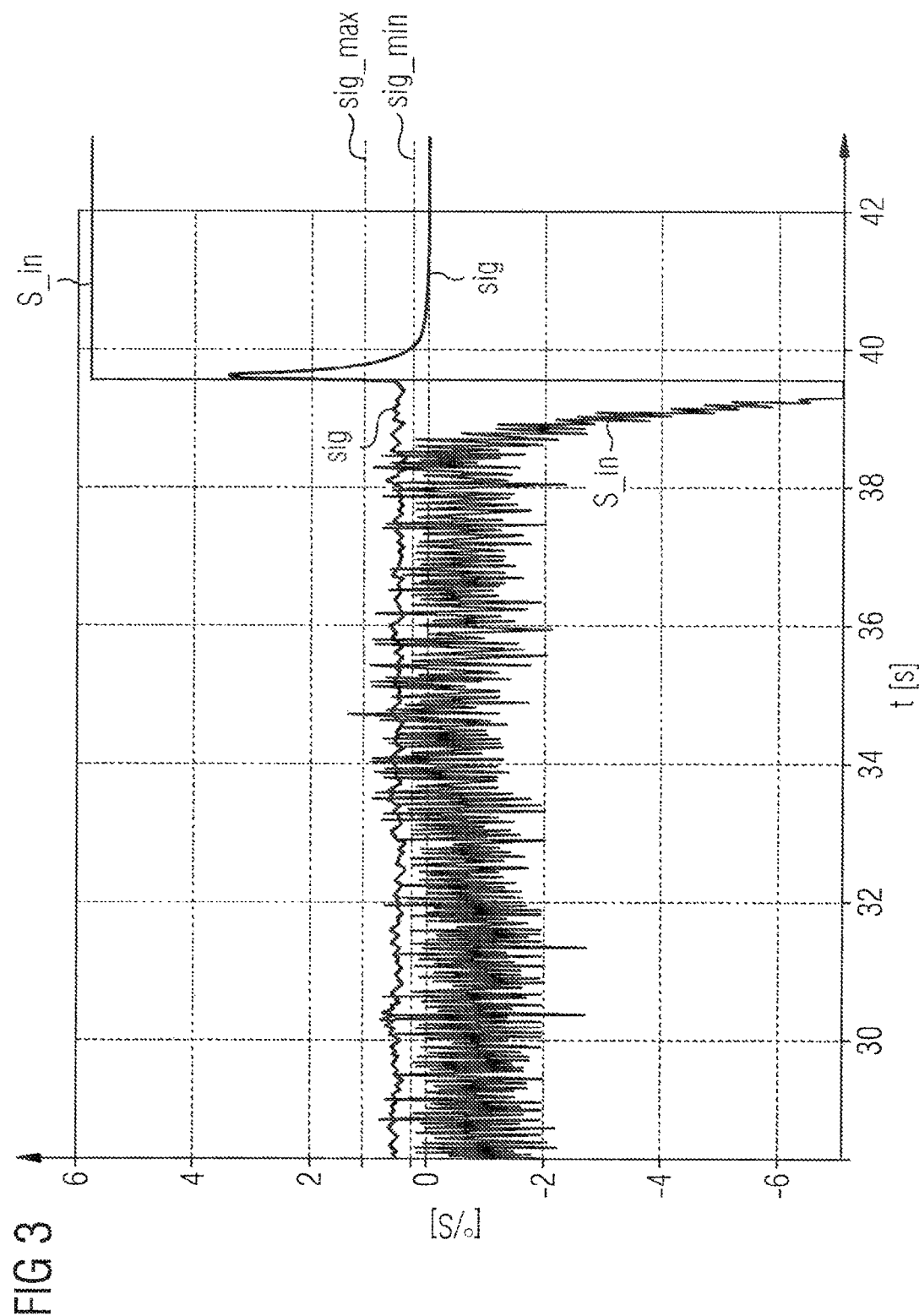

METHOD AND DEVICE FOR CHECKING A SENSOR SIGNAL

CROSS-REFERENCE TO RELATED APPLICATIONS

This application is a United States national phase filing under 35 U.S.C. §371 of International Application No. PCT/EP2007/059710, filed Sep. 14, 2007 which claims priority to German Patent Application No. 10 2006 048 604.8, filed Oct. 13, 2006. The complete disclosure of the above-identified application is hereby fully incorporated herein by reference.

TECHNICAL FIELD

The invention relates to a method and a corresponding device for checking a sensor signal of a sensor. The sensor is in particular a safety-relevant sensor in a motor vehicle or other vehicle or aircraft, an item of medical equipment or other device that requires particularly high reliability of the sensor signal.

BACKGROUND

For example in a motor vehicle a rotation rate sensor, for example a yaw sensor, is used to acquire an actual state of motion of the motor vehicle. A sensor signal of such a rotation rate sensor is evaluated in a vehicle dynamics control system and possibly used for an active intervention in the vehicle control system, for example by activating a brake system of the motor vehicle. For this reason, such a rotation rate sensor is relevant to the safety of operation of the motor vehicle. Particularly high demands are therefore placed on the availability and reliability of the sensor signal.

SUMMARY

According to various embodiments, a method and a corresponding device for checking a sensor signal can be provided, which are simple and reliable.

According to an embodiment, a method of checking a sensor signal of a sensor, may comprise the steps of: —in dependence upon the sensor signal, determining a noise signal by means of filtering with a filter that suppresses a useful signal spectrum of the sensor signal, —in dependence upon the noise signal, determining a noise quantity, which is a measure of a noise of the sensor signal, and—detecting an error of the sensor signal in dependence upon the determined noise quantity.

According to another embodiment, a device for checking a sensor signal of a sensor may be operable—to determine a noise signal in dependence upon the sensor signal by means of filtering with a filter that suppresses a useful signal spectrum of the sensor signal, —to determine a noise quantity, which is a measure of a noise of the sensor signal, in dependence upon the noise signal and—to detect an error of the sensor signal in dependence upon the determined noise quantity.

According to a further embodiment, the filter may be a high-pass filter. According to a further embodiment, the error of the sensor signal may be detected if the determined noise quantity is lower than a defined lower threshold value or greater than a defined upper threshold value. According to a further embodiment, the defined lower threshold value may be at least one of about 0 to 0.5 times and the defined upper threshold value is about 1.5 to 4 times a noise value of the sensor. According to a further embodiment, the noise quantity can be determined as a standard deviation of the noise signal. According to a further embodiment, the standard deviation for an actual time step can be determined recursively in dependence upon a first value, which was determined as the standard deviation for a preceding time step, and a second value, which represents the noise signal at the actual time step. According to a further embodiment, for determining the standard deviation for the actual time step the first value and the second value can be weighted differently in dependence upon a defined parameter.

BRIEF DESCRIPTION OF THE DRAWINGS

Embodiments of the invention are described below with reference to the schematic drawings. These show:

FIG. 1 a block diagram of a device for checking a sensor signal,

FIG. 2 a flowchart and

FIG. 3 a diagram with a characteristic of the sensor signal and of an associated standard deviation.

DETAILED DESCRIPTION

According to various embodiments, in a method and a corresponding device for checking a sensor signal of a sensor, in dependence upon the sensor signal, a noise signal is determined by means of filtering with a filter that suppresses a useful signal spectrum of the sensor signal. In dependence upon the noise signal a noise quantity is determined, which is a measure of a noise of the sensor signal. A fault of the sensor signal is detected in dependence upon the determined noise quantity.

According to various embodiments, the noise of the sensor allows an indication of the availability or the operating ability of the sensor or the quality or reliability of the sensor signal. If, for example, a connection to the sensor is interrupted or there is a short-circuit of the supply lines to the sensor, then the noise that is characteristic of the sensor is missing from the sensor signal. Furthermore, external influences on the sensor signal, for example electromagnetic interference, are easy to detect from a variation of the noise signal and hence of the noise quantity.

By means of the filtering the useful signal spectrum is suppressed, i.e. the component of the sensor signal that is determined by means of a physical quantity that is to be acquired by means of the sensor is suppressed. The useful signal spectrum is preferably suppressed to such an extent that the noise quantity is substantially independent of a time characteristic of the physical quantity. This has the advantage that a high degree of reliability may therefore be achieved in a simple manner. The method and the corresponding device are particularly suitable for carrying out a simple model-based check of the sensor signal. The model in this case is based substantially on a characteristic of the physical quantity to be acquired, which results in the useful signal spectrum.

In an embodiment, the filter is a high-pass filter. This has the advantage that the method and the device may be very simple. A limit frequency of the filter is preferably greater than a maximum frequency of the physical quantity that is to be acquired by the sensor. This maximum frequency is generally defined by the respective application of the sensor. For example, the useful signal spectrum of a yaw rate as the physical quantity to be acquired, which is acquired by means of a yaw sensor in a motor vehicle, is limited substantially to a frequency range below ca. 15 Hz. If the frequency range of the useful signal spectrum is known, then the limit frequency may be defined very easily.

In a further embodiment, the error of the sensor signal is detected when the determined noise quantity is lower than a defined lower threshold value or greater than a defined upper threshold value. This enables particularly easy and reliable detection of the error of the sensor signal.

In this connection it may be advantageous if the defined lower threshold value is approximately 0 to 0.5 times and/or the defined upper threshold value is approximately 1.5 to 4 times a noise value of the sensor. This has the advantage that the defined lower threshold value and/or the defined upper threshold value may be defined very easily in dependence upon the noise value of the sensor, which is for example noted in a technical specification of the sensor. In particular, the defined lower threshold value and/or the defined upper threshold value may be defined independently of the characteristic of the physical quantity that is to be acquired. As a result, a comparatively narrow definition of the limits is possible. This allows particularly reliable detection of the fault.

In a further embodiment, the noise quantity is determined as a standard deviation of the noise signal. This is particularly easy to implement.

In this connection it may be advantageous if the standard deviation for an actual time step is determined recursively in dependence upon a first value, which was determined as the standard deviation for a preceding time step, and a second value, which represents the noise signal at the actual time step. The standard deviation is therefore very easy to determine, in particular by means of an arithmetic unit, for example by means of a microcontroller. The determining of the standard deviation is therefore possible with a particularly low use of resources, i.e. in particular with a low requirement in terms of memory space and computing time.

In this connection it may be further advantageous if for determining the standard deviation for the actual time step the first value and the second value are weighted differently in dependence upon a defined parameter. The defined parameter represents for example a degree of smoothing or a window width for determining the standard deviation and influences an intensity, with which changes of the noise signal result in the value of the standard deviation. By providing the defined parameter, this is very easy to define. Preferably, the defined parameter is a constant.

In all of the figures elements of an identical construction or function are provided with the same reference characters.

In order to check sensors and in particular safety-relevant sensors model-based tests are carried out. These are based on a physical model that reflects the intended area of application of the sensors. The model-based tests are used to check the sensor signals of the sensors for their plausibility with regard to the physical model. Sensor signals having values, which with due regard to defined tolerances do not match the specifications of the physical model, are regarded as implausible. A very simple check in accordance with a physical model may for example consist of checking values of the sensor signals or time rates of change of the sensor signals for a departure from a defined range of values. The defined range of values is in this case defined by the physical model. To prevent false alarms, the defined range of values has to be set wide enough for the values, which may occur during the intended trouble-free operation, to lie within the defined range of values. For this reason, it is fundamentally only rough errors of the sensor signals that are detectable in this manner. In order also to be able to detect other errors of the sensor signals, the check may have to be based on a more complex physical model. This however requires more resources, for example in terms of memory space or computing time.

A sensor 1 is coupled to a device 2 (FIG. 1). The device is designed to check a sensor signal S_in of the sensor 1. An analogue-to-digital converter 3 may be provided for supplying the sensor signal S_in in digital form. The analogue-to-digital converter 3 may alternatively be comprised by the sensor 1 or by the device 2. The sensor 1 and the device 2 may however alternatively be designed to supply and/or process the sensor signal S_in in analogue form. In the following, by way of example the digital processing of the sensor signal S_in is described. The device 2 preferably comprises or takes the form of an arithmetic unit, for example a microcontroller.

The device 2 comprises a filter unit, which preferably takes the form of a high-pass filter unit HP. A high-pass filter formed by the high-pass filter unit HP has a limit frequency f_c. Preferably, the limit frequency f_c is defined such that it is greater than a maximum frequency of a physical quantity that is to be acquired by means of the sensor 1. The limit frequency f_c is therefore preferably above a useful signal spectrum of the sensor signal S_in. The useful signal spectrum is the spectrum of the physical quantity to be acquired by means of the sensor 1 and has a frequency range extending up to the maximum frequency of the physical quantity to be acquired. The high-pass filter unit HP is designed to determine in dependence upon the sensor signal S_in a noise signal S_filt, in which the useful signal spectrum of the physical quantity to be acquired is suppressed. Preferably, the useful signal spectrum is suppressed to such an extent that its amplitude or power is at most equal to that of a noise of the sensor 1.

For example, the filter of the filter unit takes the form of a recursive digital filter with filter coefficients a0, a1, a2, b1, b2. The filter coefficients a0, a1, a2, b1, b2 are defined in dependence upon a desired filter characteristic, order of the filter and the limit frequency f_c. In a corresponding manner, a number of filter coefficients a0, a1, a2, b1, b2 is also defined. Preferably, the filter is a first-order filter. The use of resources is then particularly low. The filter may however alternatively take a different form, for example the form of a non-recursive digital filter or an analogue filter.

The device 2 further comprises a noise quantity determining unit, which is designed to determine in dependence upon the noise signal S_filt a noise quantity that is a measure of the noise of the sensor signal S_in. The noise quantity determining unit preferably takes the form of a standard deviation determining unit RMS, which determines the noise quantity as a standard deviation sig of the noise signal S_filt.

The standard deviation determining unit RMS is coupled at the input side to the high-pass filter unit HP and at the output side to a checking unit CHK. The checking unit CHK is designed to detect an error ERR of the sensor signal S_in in dependence upon the determined noise quantity, i.e. in dependence upon the standard deviation sig.

FIG. 2 shows a flowchart of a program that may be executed for example by the device 2. The program starts in a step S1. In a step S2 at an actual time step k an actual value of the sensor signal S_in is acquired. In a step S3 an actual value of the noise signal S_filt at the actual time step k is determined by filtering the sensor signal S_in. Given use of the recursive digital filter, the actual value of the noise signal S_filt at the actual time instant k may be determined for example by $$S\_filt(k) = a0*S\_in(k) + a1*S\_in(k-1) + a2*S\_in(K-2) + \ldots + b1*S\_filt(k-1) + b2*S\_filt(k-2) + \ldots$$

In this case, k−1 and k−2 represent a time step that lies one time step and two time steps respectively before the actual time step k.

In a step S4 an actual value of the noise quantity, i.e. an actual value of the standard deviation sig, at the actual time step k is determined. Generally, the actual value of the standard deviation sig at the actual time step k is determined by $$sig(k)=SQRT(1/(k-1)*\Sigma(\mu\_S\_filt-S\_filt(n))^2).$$

In this case, SQRT represents a square root, $\Sigma$ a sum over all time steps n from 1 to the actual time step k, and $\mu\_S\_filt$ a mean value of the noise signal S_filt for all time steps n from 1 to the actual time step k. If by means of the filter used in the step S3 a direct component of the sensor signal S_in is extensively suppressed, for example by means of the high-pass filter, then the mean value $\mu\_S\_filt$ of the noise signal S_filt is possibly negligible. In the following, it is assumed that the direct component is suppressed to such an extent that the mean value $\mu\_S\_filt$ of the noise signal S_filt is negligible.

Preferably, the actual value of the standard deviation sig is determined recursively in dependence upon a first value, which represents a value of the standard deviation sig for a preceding time step, and a second value, which represents the actual value of the noise signal S_filt at the actual time step k. The actual value of the standard deviation sig is therefore particularly easy to determine. For this purpose, the above-mentioned formula for determining the actual value of the standard deviation sig is re-written to $$sig(k)=SQRT((k-2)/(k-1)*sig^2(k-1)+ 1/(k-1)*S\_filt^2(k)).$$

The first value and the second value are weighted differently in dependence upon the actual time step k. By providing a defined parameter M, which is preferably a constant, the weighting of the first value and the second value is defined. The standard deviation sig is therefore preferably determined by $$sig(k)=SQRT((M-2)/(M-1)*sig^2(k-1)+ 1/(M-1)*S\_filt^2(k)).$$

Preferably, the defined parameter M has a value of at least ten. The value of the defined parameter M may however alternatively be lower than ten. The greater the value of the defined parameter M, the more a characteristic of the standard deviation sig is smoothed and the less effect actual changes in a characteristic of the noise signal S_filt have upon the characteristic of the standard deviation sig.

In a step S5 it is checked whether the determined actual value of the standard deviation sig at the actual time step k is greater than or equal to a defined lower threshold value sig_min and lower than or equal to a defined upper threshold value sig_max. If this condition is met, then in a step S6 it is recognized that there is actually no error ERR of the sensor signal S_in. If however the condition in the step S5 is not met, i.e. the actual value of the standard deviation sig at the actual time step k is lower than the defined lower threshold value sig_min or greater than the defined upper threshold value sig_max, then in a step S7 the error ERR of the sensor signal S_in is detected. Preferably, upon detection of the error ERR, an error counter is incremented and optionally at the end of a defined period of time, during which the error ERR has not been detected, is decremented or reset. If a counter content of the error counter exceeds a defined threshold value, this leads for example to an indication to a user or to maintenance personnel, so that the error ERR may be eliminated.

Preferably, the defined lower threshold value sig_min and/or the defined upper threshold value sig_max are defined in dependence upon a noise value of the sensor 1. The noise value of the sensor 1 is for example noted in the technical specification of the sensor 1, for example as a standard deviation of a typical or maximum noise of the sensor 1. Preferably, the defined lower threshold value sig_min is defined as 0 to 0.5 times the noise value of the sensor 1 and/or the defined upper threshold value sig_max is defined as 1.5 to 4 times the noise value of the sensor 1. The defined lower threshold value sig_min and the defined upper threshold value sig_max may however alternatively be defined differently.

It is advantageous to set the defined lower threshold value sig_min low, for example at ca. 0.1, and to set the defined upper threshold value sig_max high, for example at ca. three or four, if the value of the defined parameter M is low, for example lower than ten. In a corresponding manner, the defined lower threshold value sig_min may be set high, for example at ca. 0.4, and the defined upper threshold value sig_max may be set low, at for example ca. two, if the value of the defined parameter M is high, for example if it is 15 or 20. This allows reliable detection of the error ERR of the sensor signal S_in and prevents false alarms.

Preferably, the program is repeated at a defined time step width T_W. The defined time step width T_W corresponds for example to a sampling rate of the analogue-to-digital converter 3.

FIG. 3 shows in a diagram an example of a characteristic of the sensor signal S_in and an associated characteristic of the standard deviation sig. In this example, the sensor 1 is a yaw sensor of a motor vehicle and the physical quantity to be acquired is the rate of yaw of the motor vehicle. The sensor signal S_in has a sampling rate of 250 Hz. The defined time step width T_W is accordingly 4 milliseconds. The defined lower threshold value sig_min in this example is 0.1°/sec and the defined upper threshold value sig_max is 1°/s. The sensor signal S_in was filtered with a recursive digital first-order high-pass filter with the limit frequency f_c of 20 Hz. The standard deviation sig was determined with the defined parameter M, the value of which in this example is 12.5 time steps. This corresponds to an averaging period of 50 milliseconds.

Up to second 38 the motor vehicle is travelling substantially straight ahead. The sensor 1 has a negative signal offset of approximately 1°/s. Clearly visible is the noise, which according to the technical specification of the sensor 1 has a standard deviation of approximately 0.4°/s. Approximately from second 38 the motor vehicle negotiates a righthand bend. This results in a drop of the sensor signal S_in. Approximately at second 39.5 the error ERR occurs. This results in a sudden rise of the sensor signal to a value of approximately 5.8°/s that is subsequently constant.

The standard deviation sig up to the occurrence of the error ERR runs within the limits that are set by the defined lower threshold value sig_min and the defined upper threshold value sig_max. Upon occurrence of the error ERR, the standard deviation sig rises very rapidly to a value above the defined upper threshold value sig_max and then, because of the constant sensor signal S_in, drops to a value below the defined lower threshold value sig_min. The error ERR of the sensor signal S_in can therefore be detected easily and reliably.

The method and the device 2 are particularly suitable for detecting rapid changes of the sensor signal S_in or sticking of the sensor signal S_in at a constant value. Such errors ERR occur for example as a result of a mechanical shock excitation, electromagnetic irradiation or signal chopping. In this case, use of resources for detecting the error ERR is low, particularly in terms of the memory space and computing time required.

The sensor 1 may be any desired sensor. In particular, however, the sensor 1 is a safety-relevant sensor, for example in a motor vehicle or other vehicle, an aircraft or an item of medical equipment. In a motor vehicle the sensor 1 is for example an acceleration sensor, a wheel speed sensor, a yaw sensor, a steering angle sensor or a spring excursion sensor, such as are used for example in a vehicle dynamics control system.

The invention claimed is:

1. A method of checking a sensor signal of a sensor, comprising the steps of:
   in dependence upon the sensor signal, determining a noise signal by means of filtering with a filter that suppresses a useful signal spectrum of the sensor signal,
   in dependence upon the noise signal, determining a noise quantity, which is a measure of a noise of the sensor signal, and
   detecting an error of the sensor signal in dependence upon the determined noise quantity,
   wherein the noise quantity is determined as a standard deviation of the noise signal, and
   wherein the standard deviation for an actual time step is determined recursively in dependence upon a first value, which was determined as the standard deviation for a preceding time step, and a second value, which represents the noise signal at the actual time step.

2. The method according to claim 1, wherein the filter is a high-pass filter.

3. The method according to claim 1, wherein the error of the sensor signal is detected if the determined noise quantity is lower than a defined lower threshold value or greater than a defined upper threshold value.

4. The method according to claim 3, wherein the defined lower threshold value is at least one of about 0 to 0.5 times and the defined upper threshold value is about 1.5 to 4 times a noise value of the sensor.

5. The method according to claim 1, wherein for determining the standard deviation for the actual time step the first value and the second value are weighted differently in dependence upon a defined parameter.

6. A device for checking a sensor signal of a sensor, which device is operable to
   determine a noise signal in dependence upon the sensor signal by means of filtering with a filter that suppresses a useful signal spectrum of the sensor signal,
   determine a noise quantity, which is a measure of a noise of the sensor signal, in dependence upon the noise signal, and
   detect an error of the sensor signal in dependence upon the determined noise quantity,
   wherein the noise quantity is determined as a standard deviation of the noise signal, and
   wherein the standard deviation for an actual time step is determined recursively in dependence upon a first value, which was determined as the standard deviation for a preceding time step, and a second value, which represents the noise signal at the actual time step.

7. The device according to claim 6, wherein the filter is a high-pass filter.

8. The device according to claim 6, wherein the error of the sensor signal is detected if the determined noise quantity is lower than a defined lower threshold value or greater than a defined upper threshold value.

9. The device according to claim 8, wherein the defined lower threshold value is at least one of about 0 to 0.5 times and the defined upper threshold value is about 1.5 to 4 times a noise value of the sensor.

10. The device according to claim 6, wherein for determining the standard deviation for the actual time step the first value and the second value are weighted differently in dependence upon a defined parameter.

11. A method of checking a sensor signal of a sensor, comprising the steps of:
    determining a noise signal based on the sensor signal by suppressing a useful signal spectrum of the sensor signal,
    determining a noise quantity based on the noise signal, which noise quantity is a measure of a noise of the sensor signal,
    wherein the noise quantity is determined as a standard deviation of the noise signal,
    wherein the standard deviation for an actual time step is determined recursively in dependence upon a first value, which was determined as the standard deviation for a preceding time step, and a second value, which represents the noise signal at the actual time step, and
    identifying a malfunction of the sensor based on the determined noise quantity.

12. The method according to claim 11, wherein the step of suppressing is performed by a high-pass filter.

13. The method according to claim 11, comprising:
    comparing the noise quantity to an upper threshold value,
    comparing the noise quantity to a lower threshold value, and
    identifying the error of the sensor signal if the noise quantity is above the upper threshold value or below the lower threshold value.

14. The method according to claim 11, wherein the malfunction of the sensor signal is associated with an electrical disconnection or short-circuit.

15. The method according to claim 11, wherein the malfunction of the sensor signal is caused by mechanical shock excitation, electromagnetic interference, or signal chopping.

16. A method of checking a sensor signal of a sensor, comprising the steps of:
    in dependence upon the sensor signal, determining a noise signal by means of filtering with a filter that suppresses a useful signal spectrum of the sensor signal,
    in dependence upon the noise signal, determining a noise quantity, which is a measure of a noise of the sensor signal, and
    detecting an error of the sensor signal in dependence upon the noise quantity,
    wherein upon detection of an error an error counter is incremented.

17. The method according to claim 16, wherein said error counter is reset or decremented after a predefined period of time.

18. The method according to claim 16, wherein said step of indicating an error is performed if said error counter exceeds a predefined threshold.

19. The method according to claim 18, wherein said threshold is defined in dependence upon a noise value of said sensor.

* * * * *